US006531729B2

(12) United States Patent
Tsuzumitani et al.

(10) Patent No.: US 6,531,729 B2
(45) Date of Patent: Mar. 11, 2003

(54) SEMICONDUCTOR DEVICE AND METHOD FOR FABRICATING THE SAME

(75) Inventors: Akihiko Tsuzumitani, Osaka (JP); Yasutoshi Okuno, Kyoto (JP); Yoshihiro Mori, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/855,773

(22) Filed: May 16, 2001

(65) Prior Publication Data

US 2001/0023977 A1 Sep. 27, 2001

Related U.S. Application Data

(62) Division of application No. 09/570,545, filed on May 12, 2000.

(30) Foreign Application Priority Data

May 14, 1999 (JP) .............................. 11-133847

(51) Int. Cl.[7] .................. H01L 29/76; H01L 27/108; H01G 4/005; H01G 4/008
(52) U.S. Cl. .................. 257/309; 257/310; 257/532; 257/306; 361/303; 361/305
(58) Field of Search .................. 257/306–310, 257/532; 361/303, 305, 306.3, 311, 312, 313

(56) References Cited

U.S. PATENT DOCUMENTS

| 5,608,247 A | * | 3/1997 | Brown | 257/306 |
| 5,618,761 A | * | 4/1997 | Eguchi et al. | 438/785 |
| 5,650,647 A | * | 7/1997 | Taguchi et al. | 257/308 |
| 6,051,859 A | * | 4/2000 | Hosotani et al. | 257/306 |
| 6,239,460 B1 | * | 5/2001 | Kuroiwa et al. | 257/300 |

FOREIGN PATENT DOCUMENTS

| JP | 409102591 A | * | 4/1997 | |
| JP | 409227966 A | * | 9/1997 | ........... C22B/11/06 |
| JP | 410107225 A | * | 4/1998 | |

OTHER PUBLICATIONS

J.W. Long et al, "Voltammetric Characterization of Ruthenium Oxide–Based Aerogels and Other RuO2 Solids: the Nature of Capacitance in Nanostructured Materials", Langmuir, vol. 15, pp. 780–785 (1999), publ. Jan. 1999.*

* cited by examiner

*Primary Examiner*—Nathan J. Flynn
*Assistant Examiner*—Johannes P Mondt
(74) *Attorney, Agent, or Firm*—Nixon Peabody LLP; Donald R. Studebaker

(57) ABSTRACT

A semiconductor device of the present invention includes an electrode, which is formed over a substrate and contains ruthenium. Crystal grains of ruthenium in the electrode have stepped surfaces.

6 Claims, 6 Drawing Sheets

SEMICONDUCTOR DEVICE AND METHOD FOR FABRICATING THE SAME

This application is a division of application Ser. No. 09/570,545, filed May 12, 2000.

BACKGROUND OF THE INVENTION

The present invention generally relates to a semiconductor device and a method for fabricating the same. More particularly, the present invention relates to a semiconductor device, including a capacitor, which can suppress leakage current sufficiently, and to a method for fabricating the device.

As a semiconductor device has been downsized, it has become more and more necessary to improve its performance by taking full advantage of the properties of materials for the device. For example, if the number of devices integrated on a single chip should be increased for a dynamic or ferroelectric random access memory (i.e., DRAM or FeRAM), which stores information thereon using transistors and capacitors in combination, then not only the transistors but also capacitors should be miniaturized.

As for a capacitor, its capacitance should be at least equal to a predetermined value, and preferably more, even if its area on the chip has been reduced as a result of downsizing. This is because noise and soft error might seriously affect the performance of an overly downsized capacitor. A capacitor has often been made of a multi-layered dielectric film, e.g., an ONO film in which silicon dioxide and silicon nitride layers are stacked one upon the other. However, since a higher capacitance should be now attained from a capacitor of a reduced size, alternative materials with dielectric constants higher than that of ONO have been looked for. A film made of any of those high-dielectric-constant materials will be herein called a "functional material film".

Examples of proposed functional material films with high dielectric constants include a perovskite oxide dielectric thin film of tantalum pentoxide ($Ta_2O_5$), strontium titanate ($SrTiO_3$, which will be abbreviated as "STO"), barium titanate ($BaTiO_3$, which will be abbreviated as "STO") or barium strontium titanate ($Ba_xSr_{1-x}TiO_3$, which will be abbreviated as "BST").

However, if one of these functional materials is used for a capacitive insulating film of a capacitor, then the electrode of the capacitor cannot be made of polysilicon anymore. This is because those functional material films are often formed within an oxidizing ambient. That is to say, if polysilicon is exposed to the oxidizing ambient, then its surface is oxidized to form a silicon dioxide film with a relatively low dielectric constant. In such a situation, even if the capacitive insulating film is made of a material with a high dielectric constant, the effective quantity of storable charge decreases due to the existence of the silicon dioxide film with a low dielectric constant.

Thus, when one of those functional materials is used, the electrode is made of a noble metal such as platinum (Pt), ruthenium (Ru) or iridium (Ir).

An exemplary structure with a capacitor made of $Ta_2O_5$ is disclosed in Japanese Journal of Applied Physics, 37, (1998), pp. 1336-1339, while an exemplary structure with a capacitor made of BST is disclosed in Technical Digest of International Electron Device and Materials (1998), pp. 253-256.

Among these noble metal materials, Ru is particularly promising as an alternative electrode material. This is because ruthenium dioxide ($RuO_2$), one of its oxides, is a conductor and because ruthenium tetroxide ($RuO_4$), another oxide thereof, has a high vapor pressure at a low temperature and can be shaped by dry etching.

However, the higher the dielectric constant of such a functional material film, the higher the density of leakage current flowing between electrodes when a voltage is applied thereto. The increase in density of leakage current adversely decreases the quantity of stored charge with time. As a result, the charge is storable by a DRAM for a shorter period of time.

Next, a technique disclosed in Articles for the $54^{th}$ Symposium on Semiconductor and Integrated Circuit Technology, pp. 12 to 17, will be briefly described. According to the technique disclosed in this article, a lower electrode of ruthenium is formed to a thickness of 100 nm on a thermal oxide film that has been formed on a silicon substrate, and then annealed for 30 seconds within a nitrogen ambient at 700° C.

Thereafter, a $Ta_2O_5$ film is formed to a thickness of 24 nm on the lower electrode by a chemical vapor deposition (CVD) process. In such a state, the composition of the $Ta_2O_5$ film deviates from that defined by stoichiometry and the $Ta_2O_5$ film contains Ta excessively. A very large amount of leakage current will flow as it is. To avoid such an unfavorable situation, the $Ta_2O_5$ film is annealed for an hour within an oxygen ambient at 550° C. As a result of this annealing, the density of leakage current will be $1 \times 10^{-8}$ A/cm$^2$ for a field intensity of 1 MV/cm, and the dielectric constant will be 30.

According to another technique disclosed in the above-identified document, oxygen may also be supplemented by performing oxygen plasma annealing at 300° C. for 10 minutes. As a result of this oxygen plasma annealing, the dielectric constant will also be about 30 and the density of leakage current will be $1 \times 10^{-8}$ A/cm$^2$ for a field intensity of 1.5 MV/cm.

The prior art capacitor has a low leakage current value after having been annealed for an hour within an oxygen ambient at 550° C. or for 10 minutes within oxygen plasma at 300° C. However, at this point in time, the $Ta_2O_5$ film has not been crystallized yet and has a dielectric constant as low as about 30, which is not so much greater compared to a conventional capacitor using an oxynitride film and a polysilicon electrode with a roughened surface. Thus, it is not advantageous to use the ruthenium electrode and the $Ta_2O$ film.

To increase the dielectric constant, the $Ta_2O_5$ film should be crystallized by being annealed at about 700° C. According to the technique disclosed in the above-identified article, the $Ta_2O_5$ film is crystallized by being annealed for 60 seconds within a nitrogen ambient at 750° C. After the $Ta_2O_5$ film has been crystallized, the electrical characteristics of the capacitor improve to a certain degree. Specifically, a sample that has been annealed for an hour within an oxygen ambient at 550° C. has a dielectric constant of about 60 and a leakage current density of $1 \times 10^{-5}$ A/cm$^2$ for a field intensity of 1 Mv/cm.

A sample that has been annealed with oxygen plasma to supplement oxygen thereto has a dielectric constant of about 60 and a leakage current density of $1 \times 10^{-8}$ A/cm$^2$ for a field intensity of 1 MV/cm or $1 \times 10^{-6}$ A/cm$^2$ for a field intensity of −1 MV/cm. As can be seen, in supplementing oxygen, the oxygen plasma annealing attains a lower leakage current density compared to the annealing within the oxygen ambient. However, even the lower leakage current density is far from being sufficiently low.

SUMMARY OF THE INVENTION

It is therefore an object of the present invention to reduce the leakage current sufficiently when an electrode for a capacitor is made of a noble metal.

A more specific object of the present invention is to reduce the leakage current sufficiently for a capacitor including a functional material film and a noble metal electrode.

To achieve these objects, when a conductor film for an electrode, e.g., a ruthenium film, is crystallized, the crystal grains of ruthenium are grown to have stepped surfaces according to the present invention.

Specifically, a first inventive semiconductor device includes an electrode, which is formed over a substrate and contains ruthenium. Crystal grains of ruthenium contained in the electrode have stepped surfaces.

In the first semiconductor device, the crystal grains of ruthenium, which is a material for the electrode, have stepped surfaces. That is to say, since the surface area of each crystal grain is greater, the apparent dielectric constant increases compared to normal crystal grains with no stepped surfaces. In addition, a plane linking adjacent crystal grains together forms an obtuse angle with the surface of each adjacent crystal grain as will be described later. Thus, an electric field is less likely to be concentrated on the interface between these crystal grains, and therefore, the leakage current decreases. Accordingly, by applying the inventive electrode to a capacitor, including a capacitive insulating film made of a functional material with a high dielectric constant, a semiconductor device with reduced leakage current can be obtained.

A second inventive semiconductor device includes: a lower electrode formed over a substrate; a capacitive insulating film formed on the lower electrode; and an upper electrode formed on the capacitive insulating film. The lower electrode includes crystal grains having stepped surfaces.

In the second semiconductor device, the crystal grains of a material for the lower electrode have stepped surfaces. That is to say, since the surface area of each crystal grain is greater, the apparent dielectric constant increases compared to normal crystal grains with no stepped surfaces. In addition, a plane linking adjacent crystal grains together forms an obtuse angle with the surface of each adjacent crystal grain. Thus, an electric field is less likely to be concentrated on the interface between these crystal grains, and therefore, the leakage current decreases. Accordingly, by applying the inventive electrode to a capacitor including a capacitive insulating film made of a functional material with a high dielectric constant, a semiconductor device with reduced leakage current can be obtained.

In one embodiment of the present invention, the lower electrode preferably contains ruthenium. In such an embodiment, the surfaces of ruthenium crystal grains are likely to be stepped.

A first inventive method for fabricating a semiconductor device includes the steps of: a) forming a conductor film containing ruthenium over a substrate; b) forming an electrode out of the conductor film by patterning the conductor film into a predetermined shape; and c) annealing the electrode and the substrate within a non-oxidizing ambient, thereby shaping the surfaces of crystal grains of ruthenium contained in the conductor film into stepped ones.

According to the first method, the surfaces of ruthenium crystal grains for the conductor film are shaped into stepped ones by conducting an annealing process within a non-oxidizing ambient. Thus, the first inventive semiconductor device is obtained by the first method.

In one embodiment of the present invention, the non-oxidizing ambient preferably contains hydrogen. Then, the surfaces of ruthenium crystal grains can be shaped into fine steps by doing so.

A second inventive method for fabricating a semiconductor device includes the steps of: a) forming a conductor film containing ruthenium over a substrate; b) forming a lower electrode out of the conductor film by patterning the conductor film into a predetermined shape; c) annealing the electrode and the substrate within a non-oxidizing ambient, thereby shaping the surfaces of crystal grains of ruthenium contained in the conductor film into stepped ones; and d) forming a capacitive insulating film on the lower electrode.

According to the second method, the surfaces of ruthenium crystal grains in the lower electrode are shaped into stepped ones by conducting an annealing process within a non-oxidizing ambient. Thus, the second inventive semiconductor device is obtained by the second method.

In one embodiment of the present invention, the non-oxidizing ambient preferably contains hydrogen.

In another embodiment of the present invention, the capacitive insulating film is preferably made of tantalum pentoxide, strontium titanate, barium titanate or barium strontium titanate. In such an embodiment, since the capacitive insulating film is made of a material with a high dielectric constant, a desired capacitance (or desired quantity of charge stored) is ensured even if the semiconductor device including the capacitor is downsized.

In still another embodiment, the step c) is preferably performed before the step d). In such an embodiment, the conductor film can be annealed within a deposition system that will be used for forming the capacitive insulating film, thus simplifying the process.

In yet another embodiment, the step c) is preferably performed after the step b). In such an embodiment, the lower electrode is patterned before the crystal grains have grown so densely through annealing that the electrode is hard to shape. That is to say, the patterning process is easier to carry out.

In still another embodiment, the step a) preferably includes the step of forming the conductor film in the shape of a bottomed cylinder. In such an embodiment, the surface area of the lower electrode is greater, and therefore, the capacitance of the capacitor increases just as intended.

BRIEF DESCRIPTION OF THE DRAWINGS

FIG. 2(a) is a schematic plan view thereof;

FIG. 2(b) is a cross-sectional view thereof taken along the line IIb—IIb in FIG. 2(a); and FIG. 2(c) is a cross-sectional view illustrating a stepped portion of the part shown in FIG. 2(b) on a larger scale.

FIG. 3(a) is a schematic plan view thereof; and

FIG. 3(b) is a cross-sectional view thereof taken along the line IIIb—IIIb in FIG. 3(a).

DESCRIPTION OF THE PREFERRED EMBODIMENTS

Embodiment 1

Hereinafter, a first embodiment of the present invention will be described with reference to the accompanying drawings.

Figure 1:
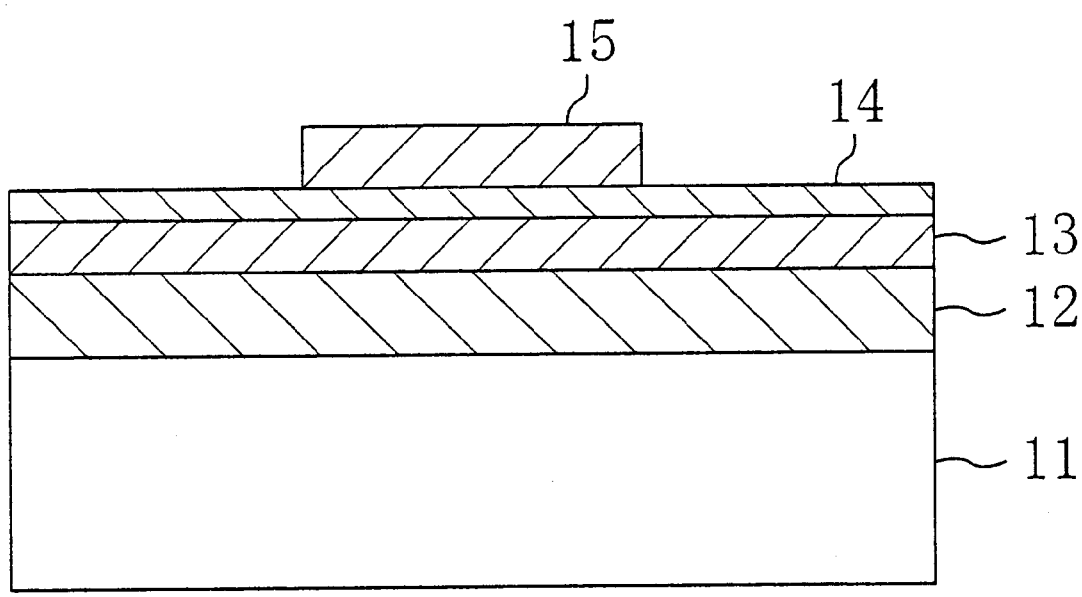
FIG. 1 is a cross-sectional view illustrating a semiconductor device according to a first embodiment of the present invention.

FIG. 1 illustrates a cross-sectional structure for a capacitor, which is an exemplary semiconductor device according to the first embodiment. As shown in FIG. 1, a thermal oxide film 12 of silicon dioxide, a lower electrode 13 of ruthenium (Ru), a capacitive insulating film 14 of $Ta_2O_5$ and an upper electrode 15 of Ru are formed in this order on a substrate 11 of silicon.

A method for fabricating a capacitor with such a structure will be briefly described.

First, the substrate 11 is heat-treated to form the thermal oxide film 12 in the upper part of the substrate 11. Next, the lower electrode 13 is formed to a thickness of about 50 nm on the thermal oxide film 12 by a sputtering technique. Then, the lower electrode 13 is annealed for about 2 minutes within a non-oxidizing ambient, e.g., mixture of argon (Ar) and hydrogen (H) gases, at about 800° C. In this case, argon gas with a high purity is preferably used, because a very small amount of oxygen is contained in argon gas ordinarily used for a semiconductor process.

Subsequently, the capacitive insulating film 14 is formed to a thickness of about 17 nm on the lower electrode 13 by a CVD process. In this process step, the lower electrode 13 is exposed to ultraviolet ozone radiation (i.e., subjected to a $UV-O_3$ process) to remedy the lack of oxygen in the capacitive insulating film 14.

Thereafter, the upper electrode 15 is formed selectively on the capacitive insulating film 14.

Following is the evaluative results of electrical characteristics of the capacitor formed in this manner.

When the lower electrode 13 was annealed within the mixture of argon and hydrogen gases, the capacitive insulating film 14 had a dielectric constant of 35. Supposing a positive potential is created where the upper electrode is positive-biased, the density of leakage current was $6.7 \times 10^{-9}$ $A/cm^2$ for an electric field intensity of 1 MV/cm. The lower electrode 13 was also annealed within argon ambient for the purpose of comparison. In that case, the capacitive insulating film 14 had a dielectric constant of 30 and the density of leakage current was $1.5 \times 10^{-8}$ $A/cm^2$ for the same electric field intensity of 1 MV/cm.

As can be seen, when the lower electrode 13 was annealed within the mixture of argon and hydrogen gases, the capacitive insulating film 14 had a dielectric constant larger than that of a comparative capacitor that was annealed within argon gas only. Also, the leakage current density of the inventive capacitor was lower than that of the comparative capacitor.

Next, the capacitive insulating film 14 is annealed for about 60 seconds within a nitrogen ambient at about 750° C., thereby crystallizing the capacitive insulating film 14. The capacitive insulating film 14 crystallized had a dielectric constant of 70 and a leakage current density of $1.8 \times 10^{-8}$ $A/cm^2$ for an electric field intensity of 1 Mv/cm. In the comparative capacitor, the capacitive insulating film had a dielectric constant of 60 and a leakage current density of $2 \times 10^{-8}$ $A/cm^2$ for the electric field intensity of 1 Mv/cm. As can be seen, even after the capacitive insulating film 14 has been crystallized, the capacitive insulating film 14 in the inventive capacitor had a dielectric constant larger than that of the comparative capacitor. Also, the leakage current density of the inventive capacitor was lower than that of the comparative capacitor.

In the foregoing example, the leakage current density was measured at room temperature in every case. However, if the capacitor according to this embodiment is implemented as a semiconductor device, it is necessary to expect how the device will operate at an elevated temperature of about 100° C. Generally speaking, as the temperature of a capacitor or the ambient temperature rises, the leakage current flowing through the capacitor-increases.

Thus, the leakage current of the inventive capacitor was measured at 125° C.

The comparative capacitor that was annealed within argon gas only had a leakage current density of $1 \times 10^{-6}$ $A/cm^2$ for an electric field intensity of 1 MV/cm. In contrast, the inventive capacitor had a leakage current density of $2 \times 10^{-7}$ $A/cm^2$ for the same electric field intensity of 1 MV. That is to say, the leakage current of the inventive capacitor can be smaller than that of the comparative capacitor.

The leakage current density differs depending on the annealing condition for the lower electrode 13 because the surfaces of ruthenium crystal grains change into stepped ones if the lower electrode 13 is annealed within the mixture of argon and hydrogen gases.

Figure 2A:
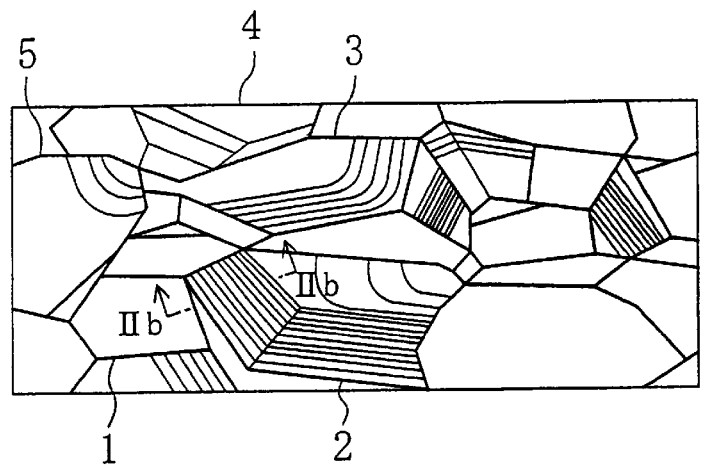
FIGS. 2(a) through 2(c) illustrate, on a larger scale, the surface shapes of ruthenium crystal grains in an electrode for a semiconductor device according to the first embodiment.

FIG. 2(a) schematically illustrates, on a larger scale, the stepped surface shapes of crystal grains in the lower electrode 13 according to this embodiment. In FIG. 2(a), crystal grains in various shapes are identified by the reference numerals 1 through 5, respectively. After the lower electrode 13 has been annealed at about 800° C., the sizes of these crystal grains 1 through 5 are between about 50 nm and about 100 nm, which are approximately two to five times larger than the counterparts before the lower electrode 13 is annealed.

Figure 2B:
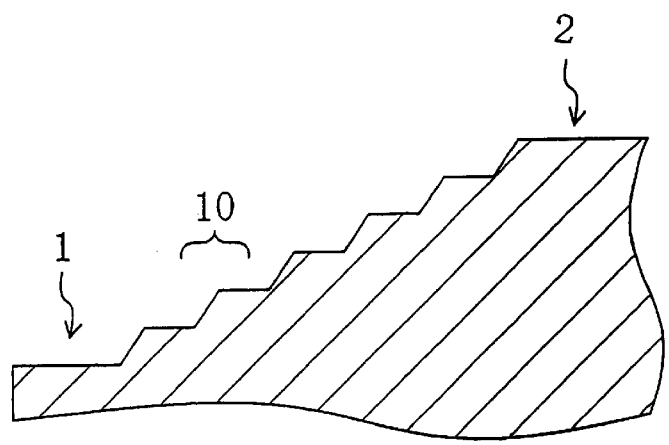

FIG. 2(b) illustrates a partial cross-section of the crystal grains 1 and 2 taken along the line IIb—IIb in FIG. 2(a). As shown in FIG. 2(b), a stepped profile is observed between the crystal grains 1 and 2. In this case, the upper surfaces of these crystal grains 1 and 2 are both (0001) planes, which are linked together via a stepped slope, i.e., the interface between the crystal grains 1 and 2.

Figure 2C:
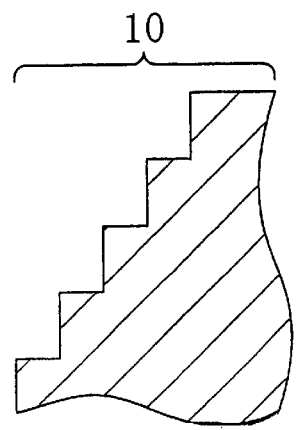

FIG. 2(c) illustrates, on a larger scale, a cross-sectional structure of a stepped portion 10 of the part shown in FIG. 2(b). As shown in FIG. 2(c), the slope of the stepped portion 10 itself has finer atomic steps.

In this manner, the surface of the lower electrode 13 has a double step shape, in which the stepped portion 10 has a slope with finer steps. Accordingly, the surface area of the lower electrode 13 and the apparent dielectric constant of the capacitive insulating film 14 are greater compared to crystal grains with non-stepped surfaces. In addition, the plane linking the crystal grains 1 and 2 together forms an obtuse angle with the upper surface of the crystal grain 1 or 2. Accordingly, there are a smaller number of interfaces that intersect with each other at acute angles. That is to say, an electric field is less likely to be concentrated on the interface between the crystal grains, thus reducing the leakage current.

Figure 3A:
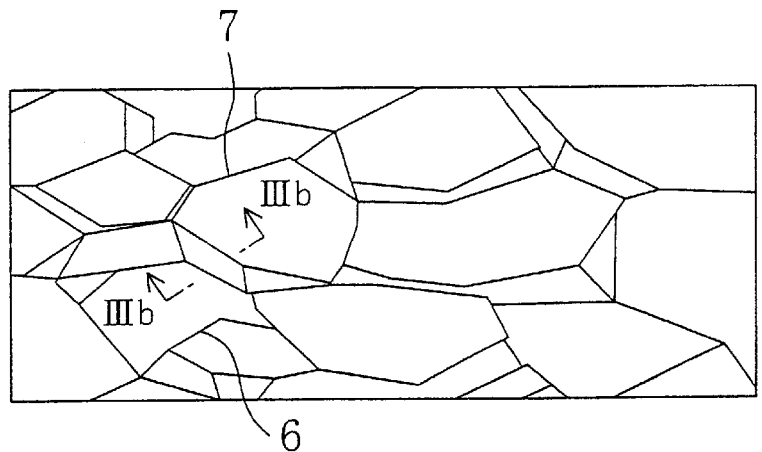
FIGS. 3(a) and 3(b) illustrate, on a larger scale, the surface shapes of ruthenium crystal grains in an electrode for a comparative semiconductor device.
Figure 3B:
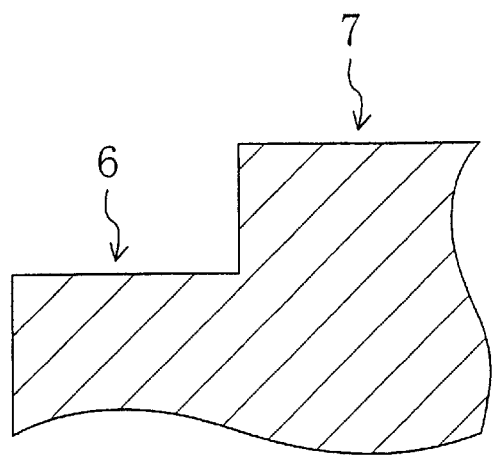

FIGS. 3(a) and 3(b) illustrate the surface shapes of ruthenium crystal grains in the lower electrode for the comparative capacitor. FIG. 3(a) is a schematic plan view thereof, while FIG. 3(b) is a partial cross-sectional view thereof taken along the, line IIIb—IIIb in FIG. 3(a). In the example illustrated in FIG. 3(a), the sizes of crystal grains are approximately equal to those of the crystal grains shown in FIG. 2(a). However, the surface shape of each crystal grain in the example shown in FIG. 3(a) is not stepped but substantially flat. This is because the surfaces of the crystal grains are oxidized with a very small amount of oxygen usually contained in argon gas to form ruthenium oxide and part of these surfaces are vaporized to stop the growth of the crystal grains at the (0001) plane. Accordingly, a stepped portion in a different shape such as that shown in FIG. 3(b) is formed. That is to say, the plane linking adjacent crystal grains 6 and 7 together cross the upper surfaces of these crystal grains 6 and 7 substantially at right angles. An electric field is concentrated at the vertical stepped portion, thus increasing leakage current.

As described above, if a conductor film for a lower electrode 13 of a capacitor includes crystal grains with stepped surfaces, the leakage current can be reduced in a capacitor including a capacitive insulating film 14 made of a metal oxide with a high dielectric constant such as $Ta_2O_5$.

The functional material with a high dielectric constant does not have to be $Ta_2O_5$, but may be STO or BST.

In the foregoing embodiment, the lower electrode 13 is annealed within the mixture of argon and hydrogen gases. Alternatively, any other non-oxidizing gas may be used instead.

In addition, the conductor film, composed of crystal grains with stepped surfaces, is applicable not only to a capacitor electrode, but also to an electrode of any other type, e.g., contact, via or pad electrode. Furthermore, the conductor film may also be applied to an interconnection line to which a relatively intense electric field is applied.

Embodiment 2

Hereinafter, a method for fabricating a semiconductor device according to a second embodiment of the present invention will be described with reference to the accompanying drawings.

Figure 4A:
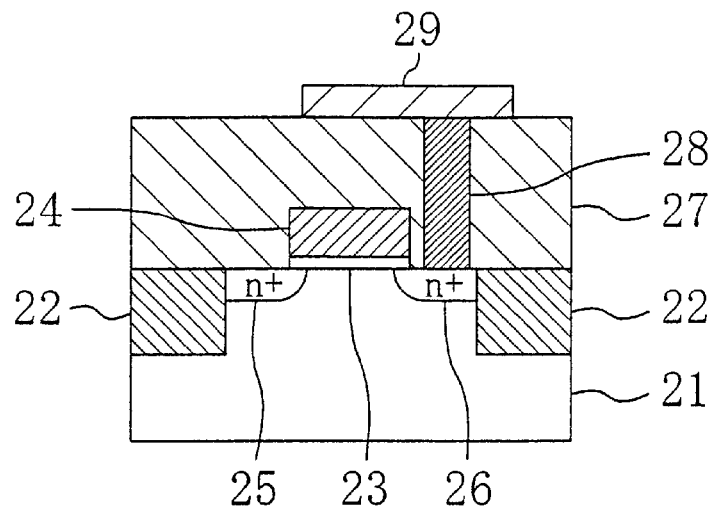
FIGS. 4(a) and 4(b) are cross-sectional views illustrating respective process steps for fabricating a semiconductor device according to a second embodiment of the present invention.
Figure 4B:
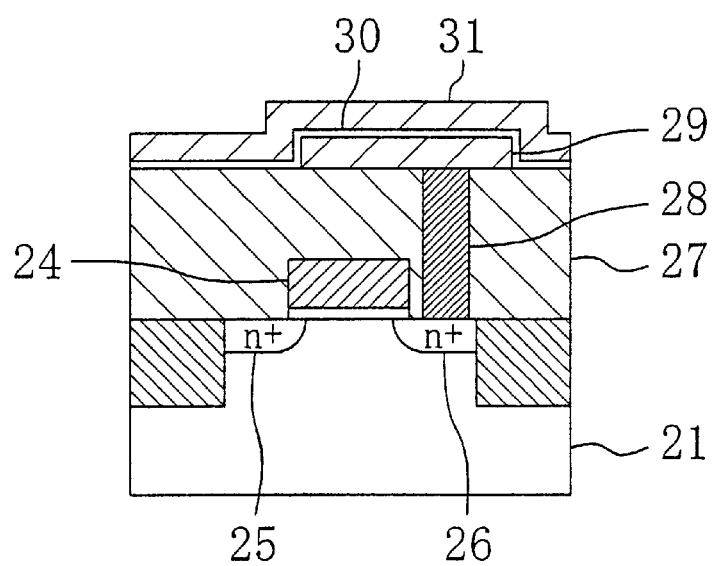

FIGS. 4(a) and 4(b) illustrate cross-sectional structures corresponding to respective process steps for fabricating a DRAM in accordance with the second embodiment.

First, as shown in FIG. 4(a), a field oxide layer 22 of silicon dioxide is selectively formed on a substrate 21 of p-type silicon. Next, a gate insulating film 23 and a gate electrode 24 are formed in an active region surrounded by the field oxide layer 22 on the substrate 21. Thereafter, first and second $n^+$-type doped regions 25 and 26 are defined to be self-aligned by implanting n-type dopant ions into the substrate 21 using the gate electrode 24 as a mask.

Subsequently, an interlevel dielectric film 27 of silicon dioxide is deposited over the entire surface of the substrate 21 as well as over the gate electrode 24. A contact 28 of polysilicon is provided over the second doped region 26 to pass through the interlevel dielectric film 27 and make electrical contact with the second doped region 26. Next, a lower electrode 29 of ruthenium is formed on the interlevel dielectric film 27 so as to be located over the gate electrode 24 and make electrical contact with the contact 28. Then, the substrate 21 with the lower electrode 29 formed thereon is annealed for about 2 minutes within a mixture of hydrogen and argon gases at about 800° C.

Thereafter, as shown in FIG. 4(b), a capacitive insulating film 30 of $Ta_2O_5$ is deposited over the entire surface of the interlevel dielectric film 27 as well as over the lower electrode 29. Subsequently, the capacitive insulating film 30 is subjected to a UV-$O_3$ process to supplement oxygen thereto and annealed for about a minute at about 750° C., thereby crystallizing $Ta_2O_5$ contained in the capacitive insulating film 30. Thereafter, an upper electrode 31 of ruthenium is deposited over the crystallized capacitive insulating film 30 by a CVD process and then annealed for about a minute at about 600° C., thereby making the capacitor recover from process-induced damage.

In the illustrated embodiment, after the lower electrode 29 has been patterned as shown in FIG. 4(a), the substrate 21 including the lower electrode 29 thereon is annealed to grow the crystal grains with stepped surfaces. This order is herein selected because it is easier to pattern (or etch) the lower electrode 29, composed of crystal grains of a smaller size, into a desired shape. In addition, since the ruthenium film shaped 29 is an isolated pattern, a stress, which is caused in the direction parallel to the substrate surface during annealing, can be relaxed. Furthermore, since the crystal grains grow in the isolated pattern of ruthenium, the number of those crystal grains is smaller.

In the foregoing embodiment, the lower electrode 29 for the capacitor is made of a single-layer ruthenium film. Alternatively, the lower electrode 29 may be a multilayer structure consisting of a ruthenium film and any other conductor film.

Also, the capacitive insulating film 30 is made of $Ta_2O_5$ in the foregoing embodiment, but may be made of STO or BST.

Moreover, in the foregoing embodiment, the lower electrode 29 is annealed within the mixture of argon and hydrogen gases. Alternatively, any other non-oxidizing gas may be used instead. The annealing process does not have to be conducted at 800° C., but may be performed at any other temperature so long as the ruthenium crystal grains grow.

Accordingly, before the capacitive insulating film 30 is deposited within a deposition system for the capacitive insulating film 30, the lower electrode 29 may be annealed in the system within a non-oxidizing gas ambient. In such a case, the lower electrode 29 can be annealed without using a furnace dedicated to annealing, thus simplifying the fabrication process.

It should be noted, however, that if the anneal temperature is raised too much, the dopant concentration profiles in the first and second doped regions 25 and 26 for the transistor section will be deformed. Also, if a silicide film is provided for the gate electrode 24 and the contact 28, defects might be caused in the silicide film.

Embodiment 3

Hereinafter, a method for fabricating a semiconductor device according to a third embodiment of the present invention will be described with reference to the accompanying drawings.

FIGS. 5(a) through 6(b) illustrate cross-sectional structures corresponding to respective process steps for fabricating a DRAM according to the third embodiment.

Figure 5A:
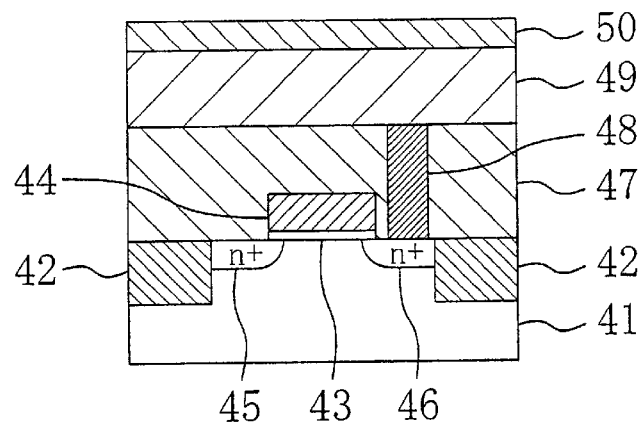
FIGS. 5(a) through 6(b) are cross-sectional views illustrating respective process steps for fabricating a semiconductor device according to a third embodiment of the present invention.

First, as shown in FIG. 5(a), a field oxide layer 42 of silicon dioxide is selectively formed on a substrate 41 of p-type silicon. Next, a gate insulating film 43 and a gate electrode 44 are formed in an active region surrounded by the field oxide layer 42 on the substrate 41. Thereafter, first and second $n^+$-type doped regions 45 and 46 are defined to be self-aligned by implanting n-type dopant ions into the substrate 41 using the gate electrode 44 as a mask.

Subsequently, an interlevel dielectric film 47 of silicon dioxide is deposited over the entire surface of the substrate 41 as well as over the gate electrode 44. A contact 48 of polysilicon is provided over the second doped region 46 to pass through the interlevel dielectric film 47 and make electrical contact with the second doped region 46. Next, first and second insulating films 49 and 50 made of silicon dioxide and silicon nitride, respectively, which will determine the shape of a lower electrode, are deposited in this order on the interlevel dielectric film 47.

Figure 5B:
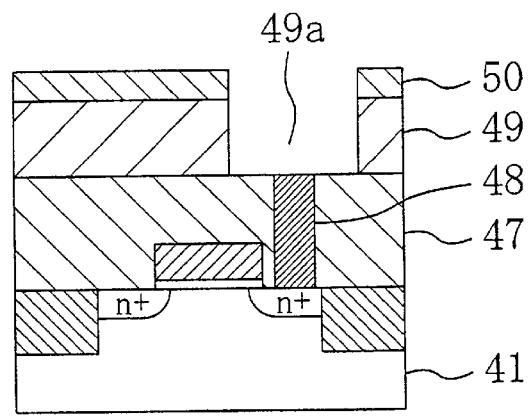

Then, as shown in FIG. 5(b), respective parts of the first and second insulating films 49 and 50, located over the contact 48, are etched away, thereby forming an opening 49a such that the top of the contact 48 and regions of the interlevel dielectric film 47 surrounding the contact 48 are exposed.

Figure 5C:
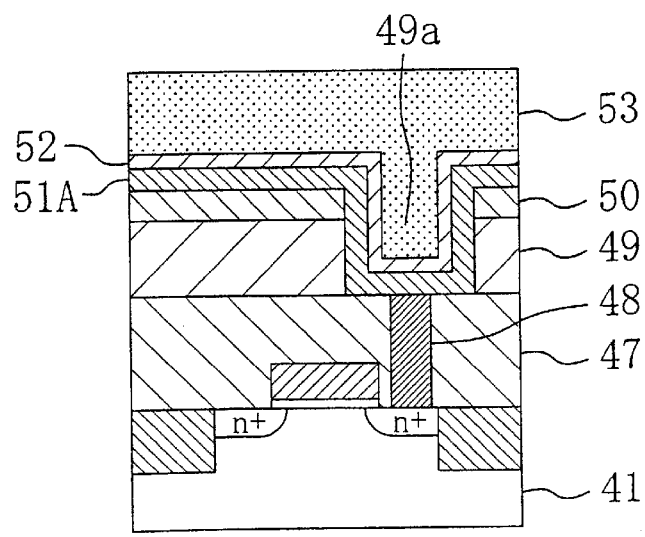

Subsequently, as shown in FIG. 5(c), a lower electrode prototype film 51A of ruthenium is deposited by a sputtering technique over the entire surface of the second insulating film 50 as well as over the bottom and sidewall of the opening 49a. Thereafter, a passivation layer 52 of silicon dioxide is deposited by a CVD process, for example, over the entire surface of the lower electrode prototype film 51A. Then, the surface of the passivation layer 52 is coated with a resist film 53 so as to fill in the opening 49a.

Figure 6A:
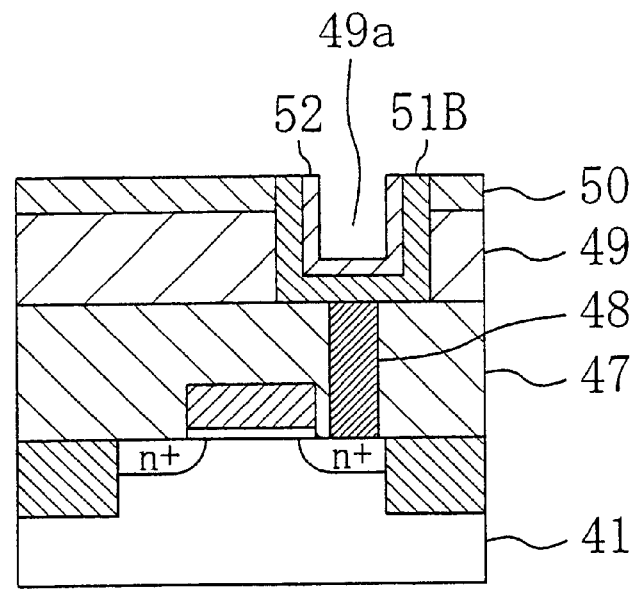

Next, the resist film 53 (except for its portion inside the opening 49a), passivation layer 52 and lower electrode prototype film 51A are etched back by an anisotropic dry etching process, thereby exposing the second insulating film 50 as shown in FIG. 6(a). As a result, a lower electrode 51B is formed out of the lower electrode prototype film 51A on the bottom and sidewall of the opening 49a. Thereafter, the remaining part of the passivation layer 52 inside the opening 49a is removed with an agent containing hydrofluoric acid (HF). Subsequently, the substrate 41 with the lower electrode 51B formed thereon is annealed for about 2 minutes within a mixture of hydrogen and argon gases at about 800° C.

As a result, ruthenium crystal grains such as those shown in FIG. 2(a) grow in the lower electrode 51B. According to the third embodiment, the lower electrode 51B is also annealed after having been patterned such that the lower electrode prototype film 51A can be shaped easily. In addition, since the ruthenium film shaped is an isolated pattern, a stress, which is caused in the direction parallel to the substrate surface during annealing, can be relaxed. Furthermore, since the crystal grains grow in the isolated pattern of ruthenium, the number of those crystal grains is smaller.

Figure 6B:
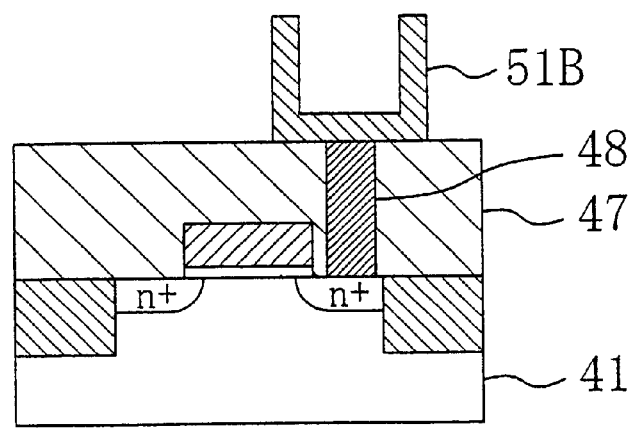

Next, as shown in FIG. 6(b), the second insulating film 50 is removed with phosphoric acid heated to about 150° C., for example, and then the first insulating film 49 is removed with hydrofluoric acid, for example. In this manner, a lower electrode 51B in the shape of a bottomed cylinder is obtained.

In the foregoing embodiment, the lower electrode prototype film 51A, except for its part inside the opening 49a, is removed by the etchback technique using the resist film 53. Alternatively, the film 51A may be removed by any other technique, e.g., chemical/mechanical polishing (CMP).

Even when the CMP process is carried out, the passivation layer 52 should also be formed on the upper surface of the lower electrode prototype film 51A. In such a case, slurry, which has been deposited inside the opening 49a and so on during the polishing process, is removable easily by lifting off the passivation layer 52 when the polishing slurry is washed out.

The lower electrode 51B may be annealed after the first and second insulating films 49 and 50 have been removed.

In all of the embodiments of the present invention, the ruthenium electrode may be annealed at any temperature between 450 and 900° C. In the argon/hydrogen mixture used as a non-oxidizing ambient gas for annealing, hydrogen may be contained at any percentage, typically 1% or more, so long as that hydrogen can react with a very small amount of oxygen contained in the argon gas.

What is claimed is:

1. A semiconductor device comprising an electrode, which is formed over a substrate and essentially composed of ruthenium, wherein the electrode has a first crystal grain and a second crystal grain, both composed of ruthenium and are adjacent to each other, and wherein the top surface of the second crystal grain is formed higher than the top surface of the first crystal grain, and an interface in the second crystal grain connected between the top surfaces of the first and second crystal grains has step surfaces.

2. The device of claim 1, wherein an obtuse angle is formed between the step surfaces and the top surfaces of the first and second crystal grains.

3. The device of claim 1, wherein the plane orientation of both the top surface of the first crystal grain and the top surface of the second crystal grain are (0001).

4. A semiconductor device comprising;

a lower electrode formed over a substrate;

a capacitive insulating film formed on the lower electrode; and an upper electrode formed on the capacitive insulating film, wherein the lower electrode includes a first crystal grain and a second crystal grain adjacent to each other, and wherein the top surface of the second crystal grain is formed higher than the top surface of the first crystal grain, and an interface in the second crystal grain connected between the top surfaces of the first and second crystal grains has step surfaces.

5. The device of claim 4, wherein the lower electrode is a conductive film essentially composed of ruthenium.

6. The device of claim 4, wherein an obtuse angle is formed between the step surfaces and the top surfaces of the first and second crystal grains.

* * * * *